(12) United States Patent
De Bernardinis et al.

(10) Patent No.: US 8,299,862 B1
(45) Date of Patent: Oct. 30, 2012

(54) TUNING CIRCUIT FOR INDUCTOR CAPACITOR (LC) TANK DIGITALLY CONTROLLED OSCILLATOR

(75) Inventors: Fernando De Bernardinis, Pavia (IT); Luca Fanori, Pavia (IT); Antonio Liscidini, Pavia (IT)

(73) Assignee: Marvell International Ltd., Hamilton (BM)

( * ) Notice: Subject to any disclaimer, the term of this patent is extended or adjusted under 35 U.S.C. 154(b) by 1 day.

(21) Appl. No.: 12/956,641

(22) Filed: Nov. 30, 2010

Related U.S. Application Data

(60) Provisional application No. 61/266,063, filed on Dec. 2, 2009.

(51) Int. Cl.
*H03B 5/12* (2006.01)

(52) U.S. Cl. ............... 331/117 FE; 331/177 V; 331/179

(58) Field of Classification Search ............ 331/117 R, 331/117 FE, 167, 177 V, 177 R, 36 C, 34
See application file for complete search history.

(56) References Cited

U.S. PATENT DOCUMENTS

| | | | |
|---|---|---|---|
| 6,583,675 B2 * | 6/2003 | Gomez | 331/17 |
| 2006/0208818 A1 * | 9/2006 | Lee et al. | 331/167 |
| 2007/0132522 A1 * | 6/2007 | Lee et al. | 331/167 |
| 2008/0204157 A1 * | 8/2008 | Tsukizawa et al. | 331/115 |

* cited by examiner

*Primary Examiner* — Ryan Johnson

(57) ABSTRACT

In one embodiment, an apparatus includes a first circuit of a digitally controlled oscillator (DCO). The first circuit has a loss component. A second circuit is coupled to the first circuit and configured to transform a positive impedance into a negative impedance in series with a negative resistance. The negative impedance includes an adjustable reactive component used to adjust a frequency of an output signal of the DCO. An equivalent reactance seen by the first circuit is less than a reactance of the adjustable reactive component.

20 Claims, 8 Drawing Sheets

TUNING CIRCUIT FOR INDUCTOR CAPACITOR (LC) TANK DIGITALLY CONTROLLED OSCILLATOR

CROSS REFERENCE TO RELATED APPLICATIONS

The present disclosure claims priority to U.S. Provisional App. No. 61/266,063 for "Very High Resolution Tuning Circuit for LC Tank Digitally Controlled Oscillators" filed Dec. 2, 2009, which is incorporated herein by reference in its entirety for all purposes.

BACKGROUND

Particular embodiments generally relate to digitally controlled oscillators (DCOs).

Unless otherwise indicated herein, the approaches described in this section are not prior art to the claims in this application and are not admitted to be prior art by inclusion in this section.

A digitally controlled oscillator (DCO) is used in systems including an all-digital phase lock loop (DLL), frequency lock loop (FLL), or in DLLs that perform clock synthesis and data recovery. In one example, the DCO is used in the all-digital DLL to generate a radio frequency (RF) signal with a frequency proportional to a reference clock.

FIG. 1 shows an example of a conventional PLL 100. A DCO 102 generates the RF signal ($f_{osc}$) with a frequency proportional to a reference clock ($f_{ref}$). The output of DCO 102 is divided by a frequency divider 104. The output of frequency divider 104 is input into a time digital converter (TDC) 106. TDC 106 receives the reference clock and the divided frequency signal and determines an error between the reference clock and the divided frequency signal. The error is output to a low pass loop filter 108, which produces a digital word that is input into DCO 102. DCO 102 uses the digital word to generate the RF signal.

FIG. 2 shows an example of a conventional DCO 200. An inductor-capacitor (LC) tank 202 includes an inductor 204 ($L_{tank}$) and capacitor ($C_{tank}$) 206. A tuning capacitor 208, a pair of cross-coupled transistors (M1 and M2) 214, and a bias current source (Ib) 210 are also provided. Tuning capacitor 208 is tuned to adjust the frequency that is output from LC tank 202. A resistance loss (resistor $R_{loss}$ 209) models the losses of inductor 204 and capacitor 206. Cross-coupled pair of transistors M1 and M2 introduce a negative resistance (−R) that compensates for the losses of LC tank 202 and keeps an output signal of DCO 200 oscillating.

FIG. 3 shows a model of DCO 200. The negative resistance −R is shown in parallel with inductor 204, capacitor 206, tuning capacitor 208, and the resistor 209. The capacitance of tuning capacitor 208 is adjusted using a capacitor bank present in LC tank 202. For example, the following equations are used to adjust the frequency:

$$f_{osc} = \frac{1}{2\pi\sqrt{C_{tank}L_{tank}}} \quad \Delta f_{osc} = -f_{osc} \cdot \frac{\Delta C_{tank}}{2},$$

where $f_{osc}$ is the output signal of DCO 200 (or LC tank 202), $\Delta f_{osc}$ is the frequency variation of the output signal, and $\Delta C_{tank}$ is the variance of the tuning capacitance of tuning capacitor 208. For example, if a 2 kHz frequency resolution at 3.3 GHz is desired where the capacitance value of capacitor 206 is $C_{tank}$=4.5 pF and the inductance value of inductor 204 is L=500 pH, then tuning capacitor 208 has a tuning capacitance of $\Delta C_{tank}$=5 actoFarads (aF). $\Delta C_{tank}$ may be the value of each capacitor in the capacitor bank. In this case, the tuning capacitance is a capacitance that is smaller than technology can implement effectively.

One solution for solving the problem of having a tuning capacitance that is too small to implement is to use dithering. FIG. 4a shows an example of a DCO model 400 using a dithering implementation. An equivalent capacitance ΔCeq seen by LC tank 202 is less than a capacitance (ΔC) 402 because of the dithering being applied using a digital switch 410. Referring to FIG. 4b, switching at a high frequency between two capacitances, $C_{tank}$ and ΔC, provides an equivalent capacitance $\Delta C_{eq}$.

FIG. 4b shows a signal 404 output by a digital ΣΔ 408 of FIG. 4a. When signal 404 is low, the capacitance is $C_{tank}$. When signal 404 is high, the capacitance is $\Delta C + C_{tank}$. A time 406 when the capacitance is $\Delta C + C_{tank}$ is a time $T_d$ and a time for a period of signal 404 capacitance is $T_r$. $T_d/T_r$ is the time in which a ance AC is added to the capacitance $C_{tank}$. This yields an equivalent capacitance shown by the equation:

$$C_{eq} = C_{tank} + \Delta C \frac{T_d}{T_r}.$$

In the implementation of FIG. 4a, a signal $f_{dth}$ is input into digital ΣΔ 408. Digital ΣΔ 408 takes an 8 bit signal and outputs a 3-bit signal 404 that is used to open and close a switch 410. Dithering of the 3 less significant bits of the 8 bit signal is provided. The value for ΔC is larger than a capacitance of around an aF, but dithering lowers the equivalent capacitance $\Delta C_{eq}$ that is seen from the physical capacitances implemented by capacitor 402.

Dithering may lower the equivalent capacitance and allow larger capacitances to be used, but noise is increased from the 3 bit signal. The quantization noise is moved to higher frequencies where generally the noise-phase specifications are more challenging. Due to this problem, the frequency of dithering may be significantly increased.

SUMMARY

In one embodiment, an apparatus includes a first circuit of a digitally controlled oscillator (DCO). The first circuit has a loss component. A second circuit is coupled to the first circuit and configured to transform a positive impedance into a negative impedance in series with a negative resistance. The negative impedance includes an adjustable reactive component used to adjust a frequency of an output signal of the DCO. An equivalent reactance seen by the first circuit is less than a reactance of the adjustable reactive component.

In one embodiment, wherein the reactive component comprises a matrix of varactors. A first set of varactors are coupled to a first reference voltage; a second set of varactors are coupled to a second reference voltage; and a variable varactor is coupled to a variable voltage signal.

In one embodiment, the second circuit comprises a cross coupled pair of transistors in series with the reactive component.

In one embodiment, a method includes receiving an error estimate of an output signal of a DCO. The error estimate is determined by comparing the output signal to a reference signal. The method further includes adjusting a reactance of a reactive component to adjust a frequency of the output signal based on the error estimate. An equivalent reactance seen by a tank circuit of the DCO is less than the reactance of the reactive component.

In one embodiment, the method coupling a first set of varactors to a first reference voltage; coupling a second set of varactors to a second reference voltage; and coupling a variable varactor to variable voltage signal.

In one embodiment, a system includes the apparatus. The DCO receives an input signal of an error estimation of an output signal of the DCO and a reference signal and adjusts the capacitance value of the capacitor based on the input signal.

The following detailed description and accompanying drawings provide a more detailed understanding of the nature and advantages of the present invention.

BRIEF DESCRIPTION OF THE DRAWINGS

FIG. 4b shows a signal output by a digital $\Sigma\Delta$ of FIG. 4a.

DETAILED DESCRIPTION

Described herein are techniques for a DCO. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
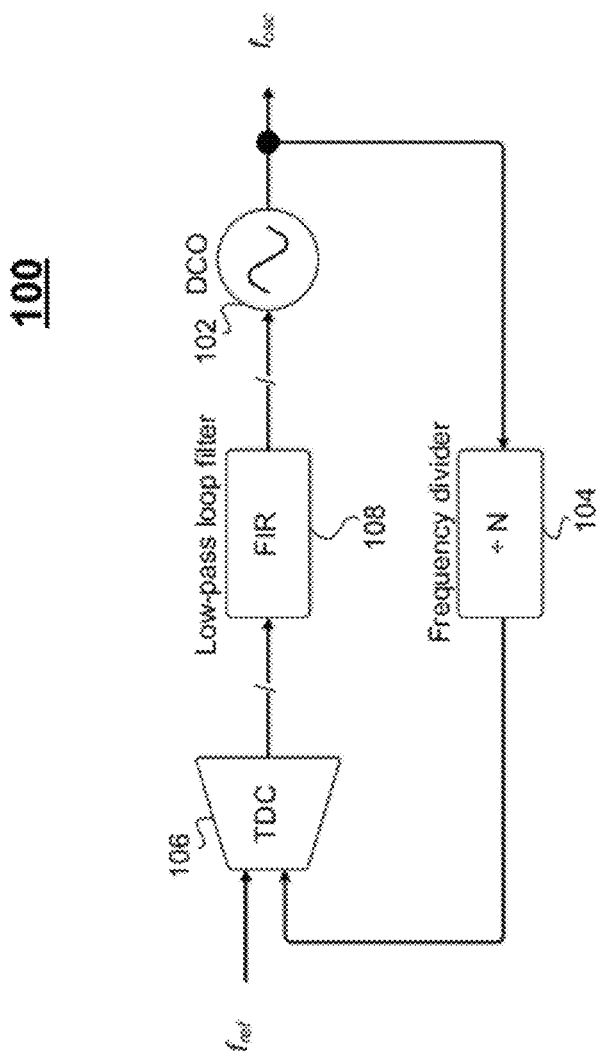
FIG. 1 shows an example of a conventional PLL.
Figure 3:
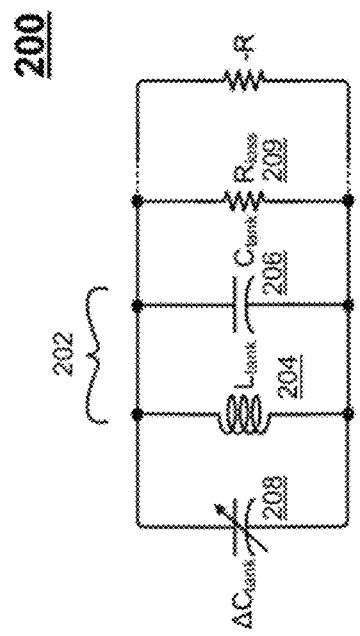
FIG. 3 shows a model of the DCO.
Figure 2:
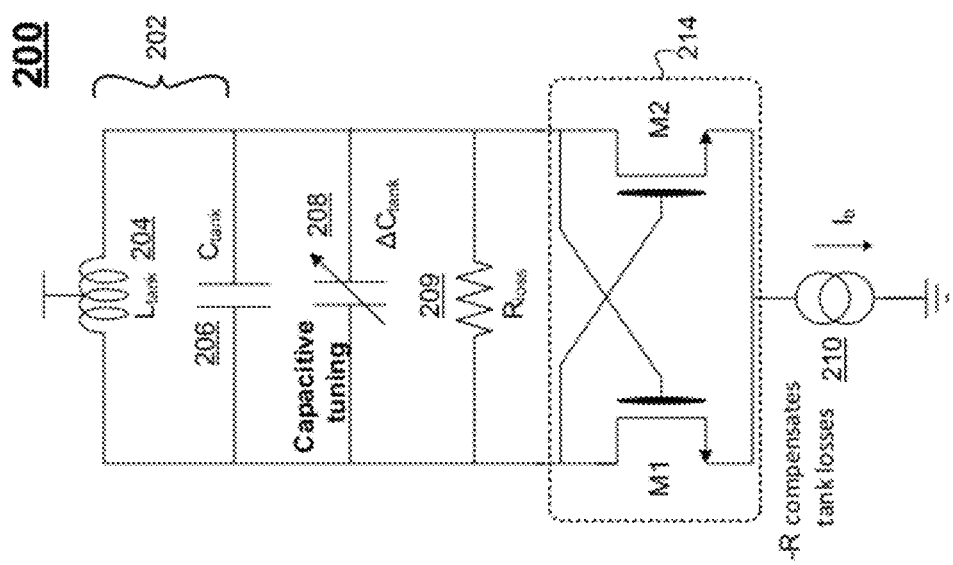
FIG. 2 shows an example of a conventional DCO.
Figure 4A:
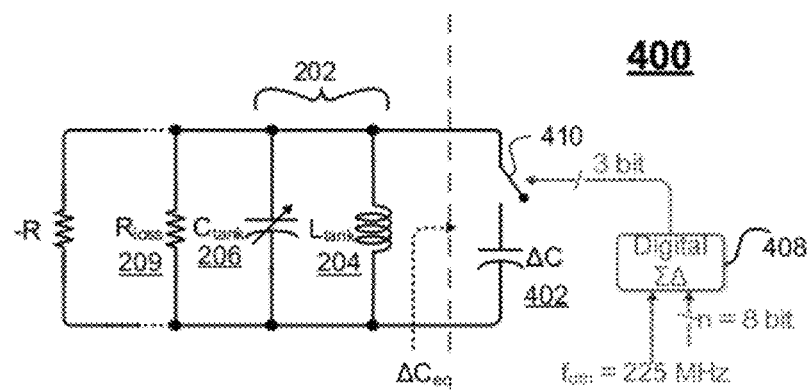
FIG. 4a shows an example of a DCO model using a dithering implementation.
Figure 4B:
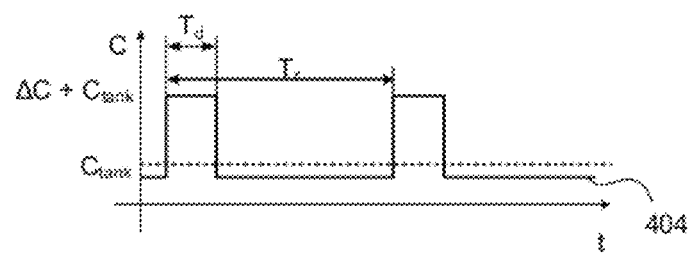
Figure 5:
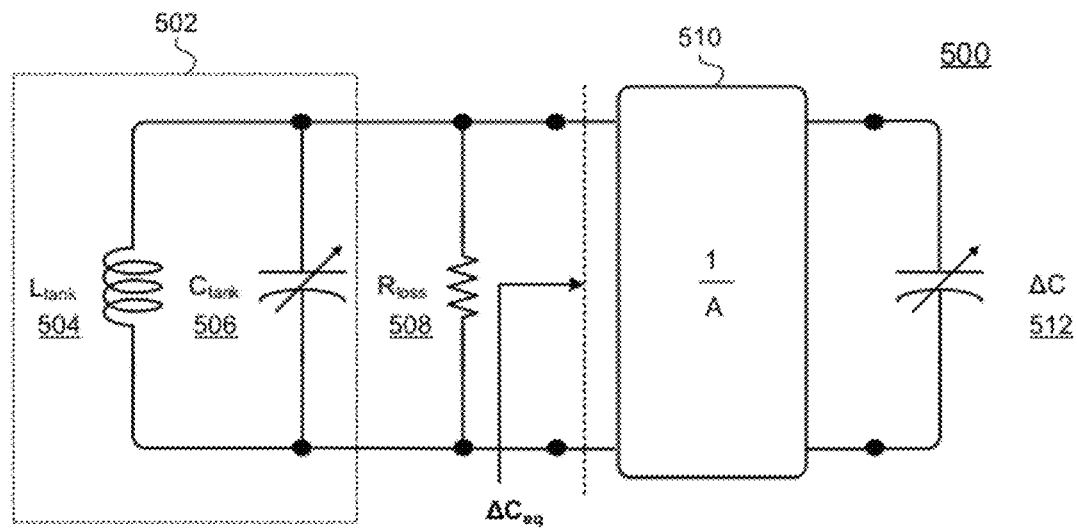
FIG. 5 shows an example of a DCO model according to one embodiment.

FIG. 5 shows an example of a DCO model 500 according to one embodiment. An LC tank 502 includes an inductor ($L_{tank}$) 504 and capacitor ($C_{tank}$) 506. LC tank 502 may be a resonant tank that may be an LC tank, a capacitor in parallel with an equivalent inductance or an inductor in parallel with an equivalent capacitance. A resistance representing the loss of LC tank 502 is shown as a resistor ($R_{loss}$) 508.

An impedance transformer 510 allows a capacitive variation ($\Delta C_{eq}$) seen by LC tank 202 to be lower than a capacitive variance of a capacitor ($\Delta C$) 512. An equivalent capacitance $\Delta C_{eq}$ may be:

$$\Delta C_{eq} = \frac{\Delta C}{A}$$

where A is a shrinking factor. The shrinking factor may be an amount of capacitive reduction that is seen by LC tank 502. $\Delta C_{eq}$ may be the resolution in capacitive tuning that can be used.

Figure 6:
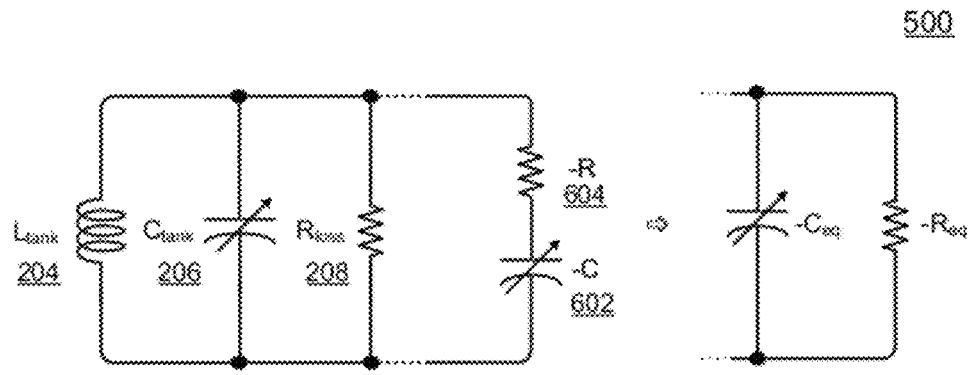
FIG. 6 shows another example of DCO model according to one embodiment.

FIG. 6 shows another example of DCO model 500 according to one embodiment. A negative capacitance shown as a capacitor (–C) 602 is in series with the negative resistance shown as a resistor (–R) 604. The capacitance –C appears shrunk in parallel to LC tank 502. Thus, a smaller capacitance can be used to enable fine frequency tuning than the actual capacitance used. The equivalent capacitance may be:

$$Ceq = \frac{C}{(\omega_0 RC)^2} = CQ_f^2, Q_f^2 \ll 1.$$

The term $(\omega_0 RC)^2$ is $1/Q_f^2$. The transistors will be described below in an implementation of a DCO. R is the resistance of resistor 604 and C is the capacitance of capacitor 602. $Q_f$ is a shrinking factor of the negative capacitance in series with the negative resistance. In one example, the capacitance –C is reduced by a factor proportional to the square of a transistor transductance, which will be described below. The negative resistance (–R) used to compensate the losses of LC tank 202 does not change significantly in that:

$$-Req \approx -R$$

Accordingly, the equivalent capacitance $-C_{eq}$ depends on the value of the transductance gm. As will be described below, the value of the negative resistance –R depends on a cross-coupled pair of transistors that are coupled to LC tank 202. The impedance transformation depends on the transductance of the cross coupled pair of transistors.

Figures 7A, 7B:
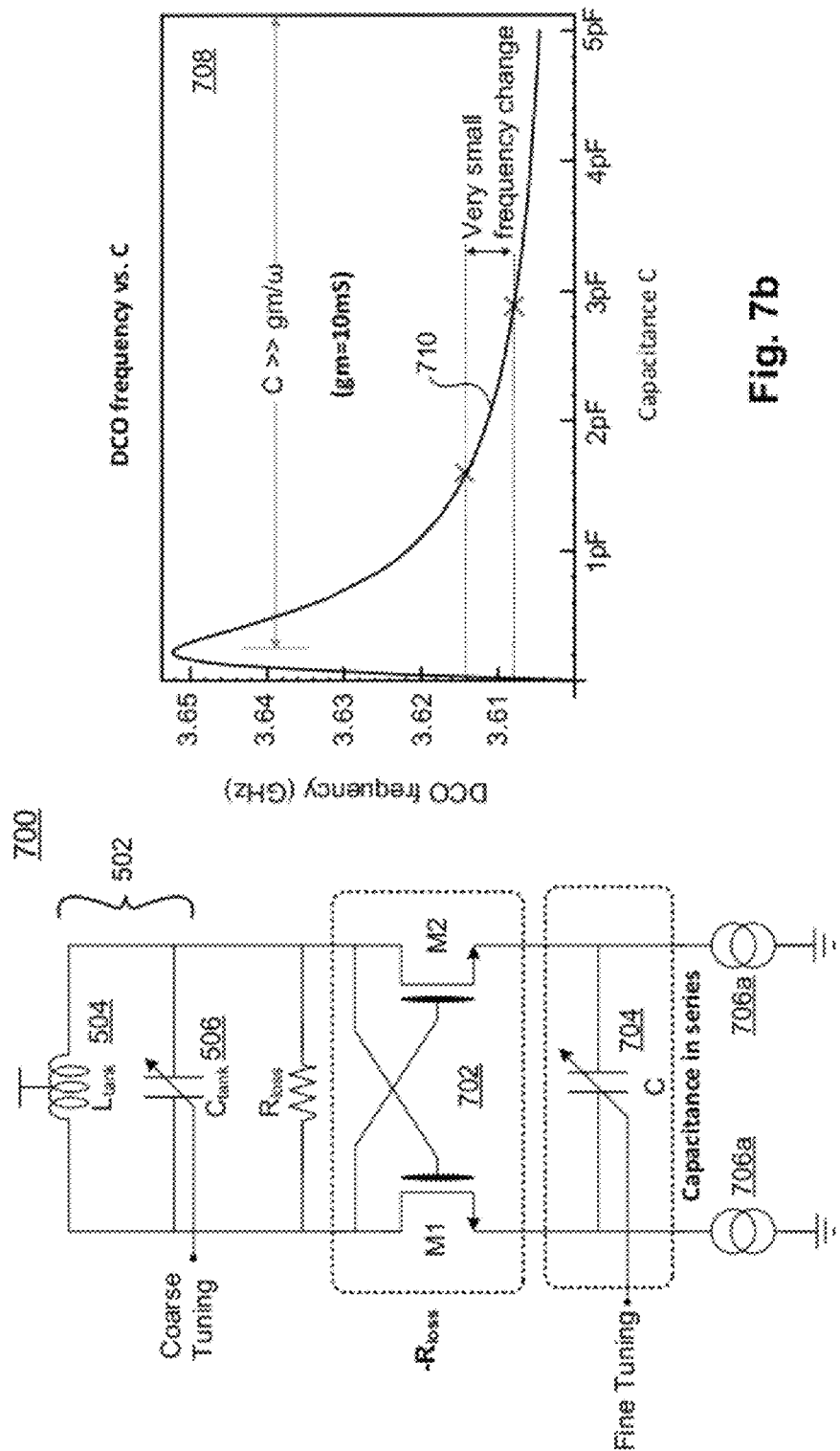
FIG. 7a shows an example of a DCO according to one embodiment.
FIG. 7b shows a graph of the DCO frequency vs. the capacitance C of a tuning capacitor according to one embodiment.

FIG. 7a shows an example of a DCO 700 according to one embodiment. DCO 700 includes an LC tank 502, which includes inductor 504 and capacitor 506. Capacitor 506 may provide coarse tuning to account for process and temperature variations. A circuit for transforming a positive impedance into a negative impedance is provided. For example, the circuit includes a cross-coupled pair of transistors (M1 and M2) 702 and a tuning capacitor (C) 704. Cross-coupled pair of transistors 702 synthesize a negative resistance. Transistors M1 and M2 have their gates cross-coupled to the drains of each other. Also, the drains of transistors M1 and M2 are respectively coupled to LC tank 502. The sources of transistors M1 and M2 are coupled to a reactive component shown as tuning capacitor (C) 704. Tuning capacitor 704 provides the negative capacitance that is shown in series with the negative resistance in FIG. 6. The reactive component may also be inductive, but a capacitive component will be used for discussion purposes. Additionally, current sources 706a are provided to bias transistors M1 and M2.

Tuning capacitor 704 allows fine tuning of the frequency of an output signal output by LC tank 502 (or DCO 700). FIG. 7b shows a graph 708 of the DCO frequency vs. the capacitance C of tuning capacitor 704 according to one embodiment. The Y axis shows the DCO frequency of the output signal in gigahertz (GHz) and the X axis shows the capacitance C. As shown around the value of capacitance value C between 2 pF and 3 pF, a curve 710 is relatively flat. Thus, a large amount of capacitance change results in a small frequency change, which provides a small frequency resolution. That is, a large amount of capacitance can be changed to achieve a smaller frequency change in the output signal of DCO 700. This allows for the use of larger values of capacitors (ΔC) in a capacitor bank of tuning capacitor 704.

For the capacitance value C>>gm/ω, then the following output signal is provided
For C>>gm/ω:

$$f_{osc} = \frac{1}{\sqrt{C_{tank} L_{tank}}} \cdot \sqrt{1 + \frac{g_m^2 L}{8C}},$$

where gm is the transductance of transistors M1 and M2, L is the inductance of LC tank 502, and $f_{osc}$ is the output signal of LC tank 502. The capacitance C at the sources of transistors M1 and M2 is reflected in parallel to LC tank 502 and is reduced by a factor proportional to the square of the transductance of transistors M1 and M2. The capacitance C of tuning capacitor 704 at the sources of transistors M1 and M2 produces the same effect as a capacitor of a reduced capacitance in parallel to LC tank 502. The placing of the tuning capacitor 704 at the sources of transistors M1 and M2 also does not affect the intrinsic phase noise of DCO 700.

Figure 8:
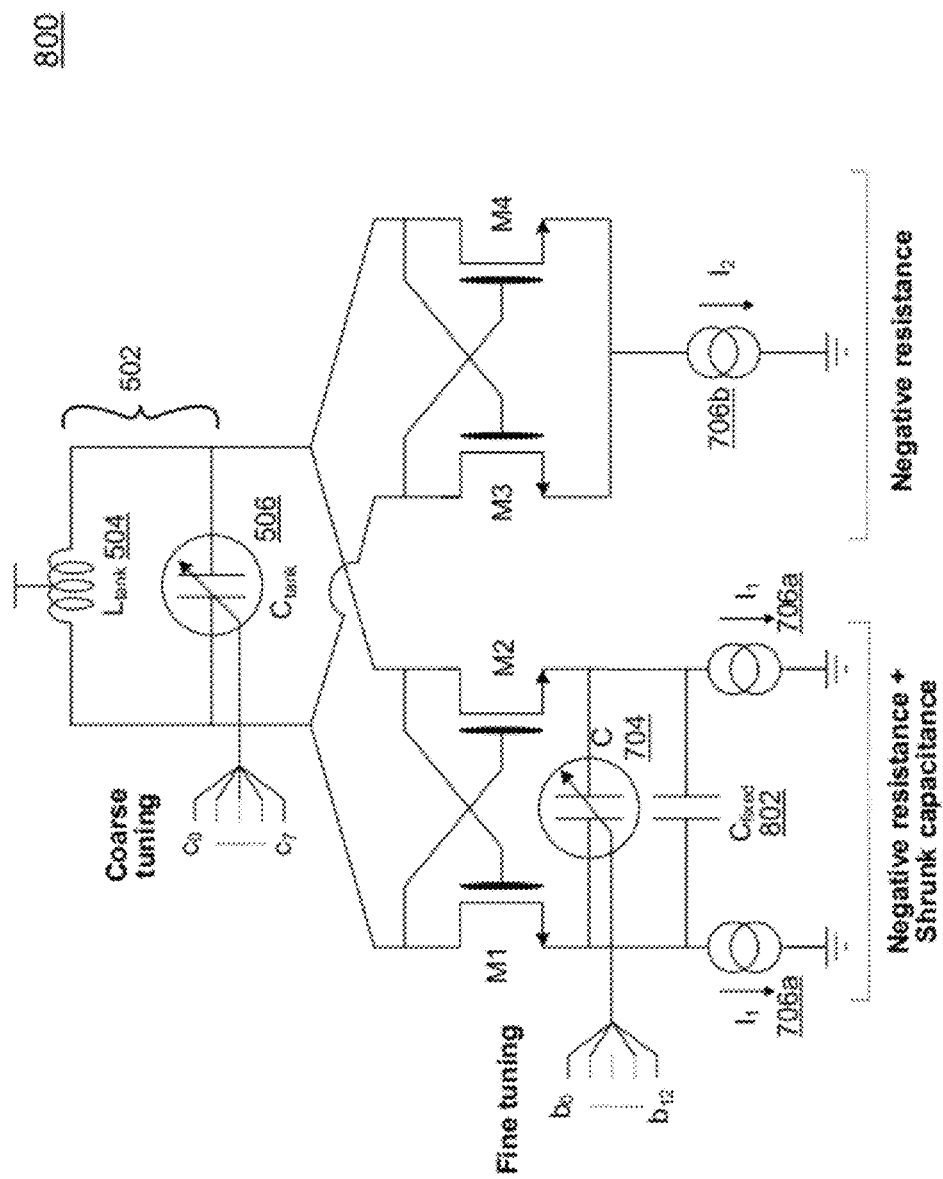
FIG. 8 shows another example of a DCO according to one embodiment.

The value of the transductance gm required to sustain the oscillation of DCO 700 (and to synthesize the negative resistance) may make the value of the capacitance C large. Transistors M1 and M2 may be separated from the cross-coupled pair of transistors that synthesize the negative resistance to allow for the capacitance C to be selected independently. FIG. 8 shows another example of a DCO 800 according to one embodiment. In DCO 800, an additional pair of cross-coupled transistors M3 and M4 is added and coupled to LC tank 502. In this case, transistors M3 and M4 provide the negative resistance (–R). Transistors M1 and M2 are then used to provide the negative capacitance. A designer is free of the restrictions of the value of transductance gm that is required to sustain the oscillation because transistors M1 and M2 are separate from transistors M3 and M4. Transistors M3 and M4 are then designed to sustain the oscillation and add a degree of freedom in choosing the shrinking factor.

In this implementation, tuning capacitor 704 is used along with a fixed capacitor ($C_{fixed}$) 802. The value of the capacitance $C_{fixed}$ is adjusted by the capacitance C.

Current sources ($I_1$) 706a are used to bias transistors M1 and M2. A current source ($I_2$) 706b is used to bias transistors M3 and M4. By programming currents $I_1$ and $I_2$, the fine tuning range and resolution of capacitance can be tuned without changing the signal amplitude of the output signal for DCO 800.

The coarse tuning of capacitor $C_{tank}$ 506 is used to compensate for processing temperature variations and to select a channel for the output signal DCO 800. Coarse tuning may use 8 bits denoted as c0-c7.

Figure 9:
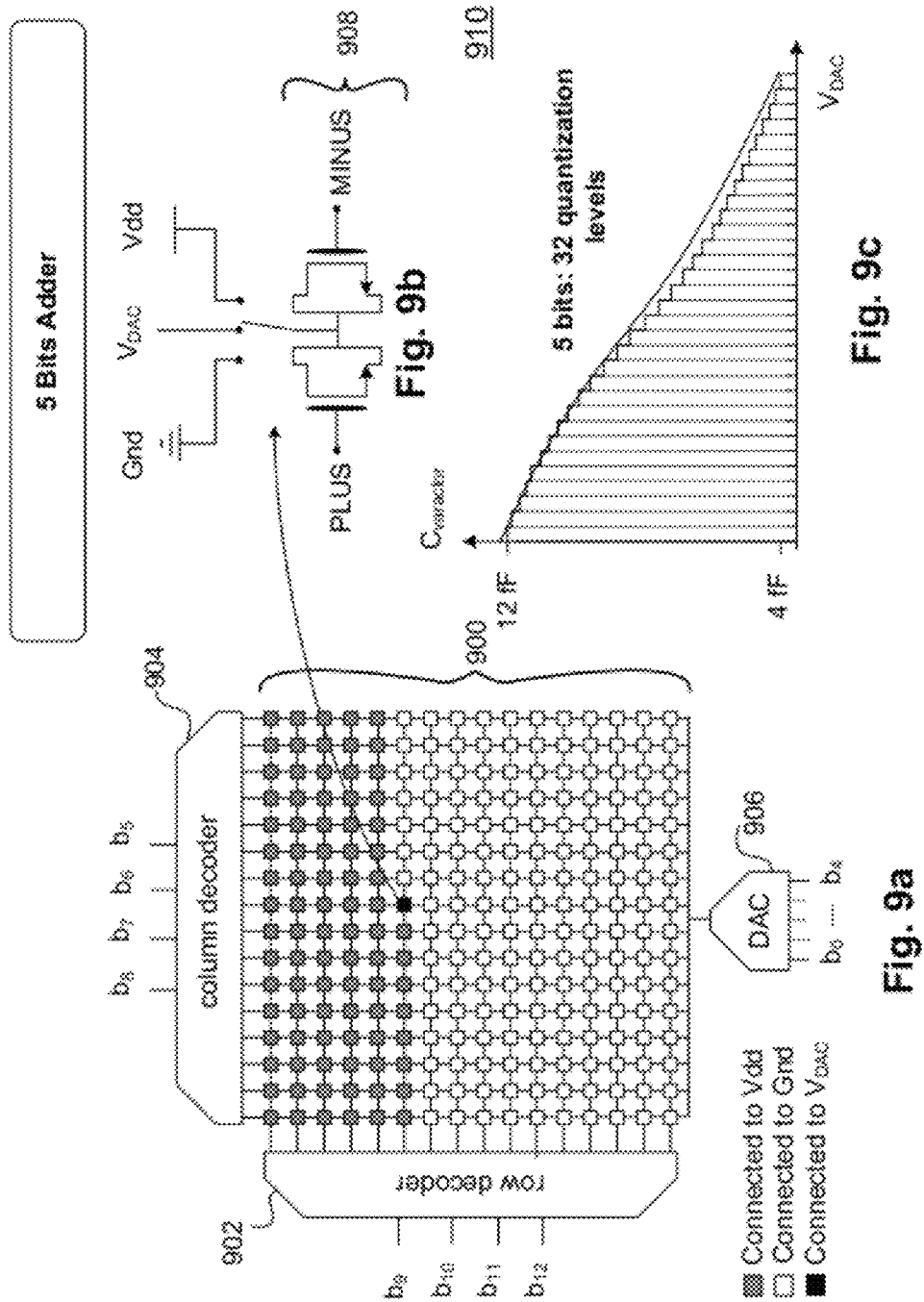
FIG. 9a shows an example of the tuning of capacitor according to one embodiment.
FIG. 9b shows an example of a varactor coupled to the voltage $V_{DAC}$ according to one embodiment.
FIG. 9c shows an example of capacitance values that are provided based on the value of the voltage $V_{DAC}$.

The fine tuning may have a 13-bit resolution represented by b0-b12. The bits are used to configure a capacitor bank. FIG. 9a shows an example of the tuning of capacitor 704 according to one embodiment. Although this implementation is shown, other implementations may be provided.

A matrix of capacitors are used for tuning the capacitance. In one embodiment, a matrix 900 of varactors are used. A varactor may be a type of diode that has a variable capacitance that is a function of the voltage impressed on its terminals. Matrix 900 of varactors are coupled to a row decoder 902, a column decoder 904, and a digital-to-analog (DAC) converter 906.

Row decoder 902 receives bits b9-b12, column decoder 904 receives bits b5-b8, and DAC 906 receives bits b0-b4. Depending on bits b0-b12, different values of capacitance may be provided. For example, a varactor may be coupled to a supply voltage (Vdd), ground (Gnd), or a voltage $V_{DAC}$. The varactors are toggled in and out to determine a total capacitance. For example, varactors coupled to the supply voltage are turned on and varactors coupled to ground are turned off. Also, the varactor coupled to the voltage $V_{DAC}$ is also turned on. The varactors coupled to the supply voltage provide a fixed amount of capacitance and the varactor coupled to the voltage $V_{DAC}$ has a variable capacitance.

FIG. 9b shows an example of a varactor 908 coupled to the voltage $V_{DAC}$ according to one embodiment. As shown, the varactor may be coupled to ground, supply voltage $V_{DD}$, or voltage $V_{DAC}$. When varactor 908 is coupled to voltage $V_{DAC}$, different values of capacitance are provided depending on the value of the voltage $V_{DAC}$. For example, FIG. 9c shows an example of capacitance values that are provided based on the value of the voltage $V_{DAC}$. In a graph 910, the Y axis is the capacitance value of varactor 908. Also, the X axis shows the value of the voltage $V_{DAC}$.

For 5 bits, 32 quantization levels are provided. As shown, the values of the capacitance ($C_{varactor}$) may vary from 4fF to 12fF. Using this varying capacitance, fewer varactors may be needed to achieve a 13-bit resolution of capacitance for tuning capacitor 704. For example, if a 13-bit resolution is needed, $13^{13}$ varactors are needed to achieve this resolution. However, using a matrix of 256 varactors, the 13-bit resolution can be achieved using a variable capacitance provided by varactor 908. Less area on a chip is used and routing is also simplified.

The coarse tuning of capacitor 506 may also use a structure similar to matrix 900. However, the matrix may be smaller to due to the 8-bit resolution. The 3 least significant bits of the matrix used in the coarse-tuning array may be substituted with a varactor able to be tuned to different capacitances using a voltage $V_{DAC}$ as described in FIG. 9a.

Figure 10:
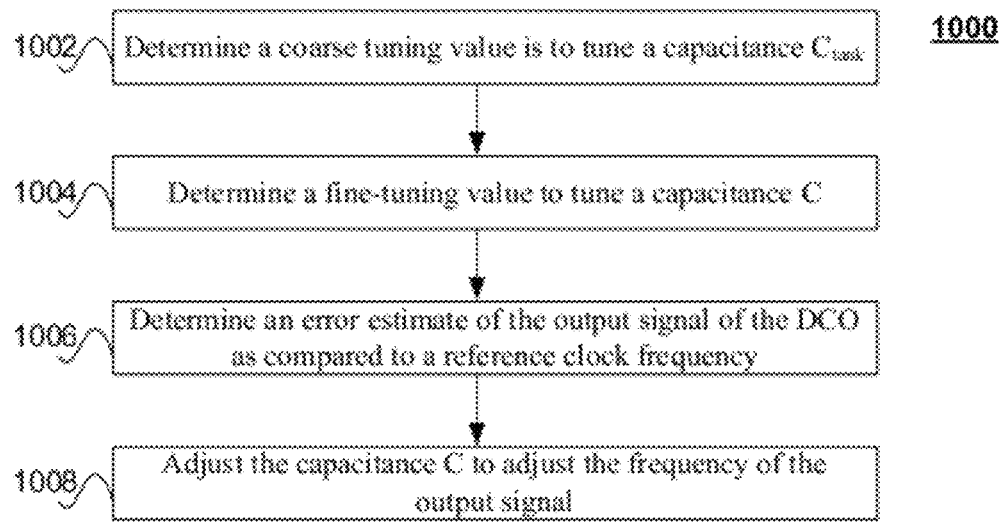
FIG. 10 shows a simplified flowchart of a method for providing an oscillating signal using a DCO according to one embodiment.

FIG. 10 shows a simplified flowchart 1000 of a method for providing an output signal using DCO 700 according to one embodiment. At 1002, a coarse tuning value is determined to tune a capacitance $C_{tank}$ for capacitor 506. At 1004, a fine-tuning value is determined to tune a capacitance C for capacitor 704.

At 1006, an error estimate of the output signal of DCO 700 as compared to a reference clock frequency is determined. At 1008, the capacitance C of capacitor 704 is adjusted to adjust the frequency of the output signal of DCO 700 based on the error estimation.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
a first circuit of a digitally controlled oscillator (DCO), the first circuit having a loss component;
a second circuit coupled to the first circuit, the second circuit comprising:
 a first cross coupled pair of transistors coupled to the first circuit; and
 an adjustable reactive component coupled to the first cross coupled pair of transistors, the adjustable reactive component configured to adjust a frequency of an output signal of the DCO, wherein the second circuit is configured to transform a positive impedance into a negative impedance and provide a first negative resistance;
a third circuit coupled to the first circuit, the third circuit comprising a second cross coupled pair of transistors coupled to the first circuit, wherein the third circuit is configured to provide a second negative resistance and does not include a reactive component,
wherein:
an equivalent reactance seen by the first circuit is less than a reactance of the adjustable reactive component, and
the second circuit and the third circuit are between the first circuit and a supply.

2. The apparatus of claim 1, wherein the adjustable reactive component comprises a set of capacitors, wherein the set of capacitors are used to adjust the reactance of the adjustable reactive component.

3. The apparatus of claim 1, wherein:
the second circuit comprises a negative capacitance in series with the first negative resistance,
the negative capacitance appears as the equivalent reactance in parallel to the first circuit, and
the first negative resistance and the second negative resistance appear as an equivalent resistance in parallel to the first circuit.

4. The apparatus of claim 1, wherein the adjustable reactive component is respectively coupled between a terminal of each of the first cross coupled pair of transistors and a first current source.

5. The apparatus of claim 4, wherein a terminal of each of the second cross coupled pair of transistors is respectively coupled to a second current source.

6. The apparatus of claim 5,
wherein the first current source and the second current source are used to control a frequency of the output signal.

7. The apparatus of claim 1, wherein the reactive component comprises a tuning capacitor, the apparatus further comprising a fixed capacitor coupled to the tuning capacitor, wherein the equivalent reactance is represented by a capacitance of the tuning capacitor and a capacitance of the fixed capacitor.

8. The apparatus of claim 1, wherein the first circuit comprises a tank circuit.

9. An apparatus comprising:
a first circuit of a digitally controlled oscillator (DCO), the first circuit having a loss component; and
a second circuit coupled to the first circuit, the second circuit configured to transform a positive impedance into a negative impedance in series with a negative resistance, wherein the negative impedance includes an adjustable reactive component used to adjust a frequency of an output signal of the DCO,
wherein:
an equivalent reactance seen by the first circuit is less than a reactance of the adjustable reactive component, and
the reactive component comprises a matrix of varactors, wherein:
 a first set of varactors are coupled to a first reference voltage;
 a second set of varactors are coupled to a second reference voltage; and
 a variable varactor is coupled to a variable voltage signal.

10. The apparatus of claim 9, further comprising a digital to analog converter configured to generate the variable voltage signal to control a capacitance of the variable varactor, the capacitance varying based on a voltage of the variable voltage signal.

11. The apparatus of claim 9, wherein:
the first set of varactors are turned on to provide a first capacitance;
the second set of varactors are turned off; and
the variable varactor provides a second capacitance that depends on the variable voltage signal.

12. The apparatus of claim 1, wherein the equivalent reactance depends on a transductance of a cross coupled pair of transistors of the second circuit.

13. A system comprising the apparatus of claim 1, wherein:
the DCO receives an input signal corresponding to an error estimation of the output signal of the DCO, the error estimation being determined based on a reference signal; and
the DCO adjusts the reactance of the reactive component based on the input signal.

14. The system of claim 13, further comprising:
a frequency divider configured to divide the output signal;
a converter configured to compare the reference signal to the divided output signal to determine the error estimation; and
a filter configured to generate the input signal received by the DCO based on the error estimation.

15. A method comprising:
providing a first negative resistance to a tank circuit using a first circuit;
providing a second negative resistance to the tank circuit using a second circuit;
receiving an error estimate of an output signal of a DCO, the error estimate determined by comparing the output signal to a reference signal; and
adjusting a reactance of a reactive component included in the first circuit to adjust a frequency of the output signal based on the error estimate,
wherein:
an equivalent reactance seen by a tank circuit of the DCO is less than the reactance of the reactive component,
the second circuit does not include a reactive component, and
the first circuit and the second circuit are between the tank circuit and a supply.

16. The method of claim 15, wherein the reactive component comprises a set of capacitors, wherein adjusting the reactance of the reactive component comprises turning on a number of capacitors in the set of capacitors.

17. The method of claim 15, wherein:
the reactance of the reactive component comprises a negative capacitance, the negative capacitance being in series with the first negative resistance, and
the negative capacitance appears as the equivalent reactance in parallel to the first circuit,
the first negative resistance and the second negative resistance appear as an equivalent resistance in parallel to the first circuit.

18. The method of claim 15, further comprising controlling a first current source to control a frequency of the output signal.

19. The method of claim 15, further comprising:
coupling a first set of varactors to a first reference voltage;
coupling a second set of varactors to a second reference voltage; and
coupling a variable varactor to variable voltage signal.

20. The method of claim 19, further comprising generating the variable voltage signal to control a reactance of the variable varactor, the reactance of the variable varactor varying based on a voltage of the variable voltage signal.

* * * * *